(12) United States Patent
Despont et al.

(10) Patent No.: US 11,809,136 B2
(45) Date of Patent: Nov. 7, 2023

(54) MULTISTAGE MICROMECHANICAL TIMEPIECE AND METHOD FOR MAKING SAME

(71) Applicant: CSEM Centre Suisse d'Electronique et de Microtechnique SA—Recherche et Développment, Neuchâtel (CH)

(72) Inventors: Michel Despont, Cheseaux-Noréaz (CH); Philippe Niedermann, Peseux (CH)

(73) Assignee: CSEM Centre Suisse d'Electronique et de Microtechnique SA—Recherche et Développment, Neuchâtel (CH)

( * ) Notice: Subject to any disclaimer, the term of this patent is extended or adjusted under 35 U.S.C. 154(b) by 1112 days.

(21) Appl. No.: 16/486,747

(22) PCT Filed: Feb. 7, 2018

(86) PCT No.: PCT/EP2018/052999
§ 371 (c)(1),
(2) Date: Oct. 25, 2019

(87) PCT Pub. No.: WO2018/153664
PCT Pub. Date: Aug. 30, 2018

(65) Prior Publication Data
US 2020/0050150 A1    Feb. 13, 2020

(30) Foreign Application Priority Data
Feb. 22, 2017    (CH) ..................................... 00205/17

(51) Int. Cl.
*G04B 17/06*    (2006.01)
*G04B 29/02*    (2006.01)
(Continued)

(52) U.S. Cl.
CPC ........... *G04B 17/06* (2013.01); *G04B 29/022* (2013.01); *G04B 29/027* (2013.01);
(Continued)

(58) Field of Classification Search
CPC ........ G04B 29/027; G04B 17/06; H02N 1/00; H02N 2/00
See application file for complete search history.

(56) References Cited

U.S. PATENT DOCUMENTS

2014/0286142 A1\* 9/2014 Stranczl ................. G04B 35/00
368/131
2016/0139563 A1\* 5/2016 Rochat ................. G04B 43/002
368/208

(Continued)

FOREIGN PATENT DOCUMENTS

| CH | 707808 | 9/2014 |
|---|---|---|
| EP | 2911012 | 8/2015 |
| WO | WO2013093108 | 6/2013 |

OTHER PUBLICATIONS

International Search Report (w/English translation) and Written Opinion for PCT/EP2018/052999 dated Sep. 5, 2018.

*Primary Examiner* — Renee S Luebke
*Assistant Examiner* — Matthew Daniel Hwang
(74) *Attorney, Agent, or Firm* — Patterson Thuente, P.A.

(57) ABSTRACT

A micromechanical timepiece, and a method for making the same, having a plurality of mutually secured functional sub-assemblies stacked in a direction (Z) to form a multistage assembly, wherein each functional sub-assembly comprises a single semiconductor material and is secured to another sub-assembly via bridges made of the semiconductor material, and in that at least one sub-assembly comprises at least two portions, the portions being movable relative to each other and relative to another sub-assembly to which at (Continued)

least one of the portions is secured via at least one deformable link integrally formed between the portions.

11 Claims, 4 Drawing Sheets

(51) Int. Cl.
  *G04D 3/00* (2006.01)
  *B81B 3/00* (2006.01)
  *B81C 1/00* (2006.01)
  *B81B 5/00* (2006.01)
(52) U.S. Cl.
  CPC .............. *G04D 3/0069* (2013.01); *B81B 3/00* (2013.01); *B81B 5/00* (2013.01); *B81C 1/00142* (2013.01)

(56) References Cited

U.S. PATENT DOCUMENTS

| | | | |
|---|---|---|---|
| 2016/0299470 A1* | 10/2016 | Conus | G04B 17/06 |
| 2016/0370764 A1* | 12/2016 | Cusin | G04B 19/044 |
| 2017/0285573 A1* | 10/2017 | Manousos | G04B 19/12 |

* cited by examiner

MULTISTAGE MICROMECHANICAL TIMEPIECE AND METHOD FOR MAKING SAME

RELATED APPLICATIONS

This present application is a National Phase entry of PCT Application No. PCT/EP2018/052999 filed Feb. 7, 2018 which claims priority to Swiss Application No. 00205/17 filed Feb. 22, 2017, the contents of each being incorporated herein by reference in their entireties

TECHNICAL FIELD

The present invention relates to the field of clockmaking. It concerns more particularly a multi-level micromechanical timepiece including elements movable relative to each other and having a monolithic structure. The invention finds particular application to the production of oscillators and regulator components for clockmaking.

The invention also relates to a method for manufacturing such a multi-level micromechanical timepiece.

BACKGROUND ART

Clockwork mechanisms require the production and the implementation of a very large number of pieces of various sizes, shapes and sections, arranged relative to each other within the mechanisms to fulfill the different particular functions assigned to these mechanisms, whether it is the time date display and counting or other additional functions.

In order to improve reliability, the isochronism and the power reserve inter alia, the various constituent pieces of such mechanisms generally have changed only little in their shapes but have however considerably changed in their constituent materials, their manufacturing methods, their mechanical and physical properties and therefore, their pure performances and those of mechanisms implementing them.

Major advances have occurred during the last ten years with the implementation of clockmaking components based on silicon, manufactured in particular following techniques derived from the industry of the micro-technologies of the semiconductors and the microelectronics.

Wheel sets such as escape wheels but especially springs, in particular balance wheel regulator hairsprings have thus been widely proposed in the state of the art, these having in particular better coefficients of friction, greater mechanical strength and better thermo-compensation, thus improving power reserve and isochronism of the mechanisms incorporating them at the very least.

These same techniques have also allowed the production of integrated functional members or micro-systems such as oscillators, including elements movable in rotation relative to each other in the same plane about a virtual pivot axis through flexible blades integrally formed between the movable elements, such as for example described in the application EP 2911012 A1 in the name of the Applicant.

However, a limitation of these clockmaking components with movable elements on flexible blades obtained based on semiconductor materials lies in their substantially single-level character, that is to say they can contain movable elements only in one plane in space. It is thus not possible to this day to make, from a semiconductor substrate, a piece including different functional subassemblies secured to each other along one or several axis/axes in space while each including where appropriate functional elements movable relative to each other.

Attempts have indeed been made by assembling pieces made in a first stage separately then joined by fusion for example. However, the components resulting therefrom are of lower quality due to a less accurate alignment of the structures forming the different levels or simply due to a quality of the less controlled link interface.

Moreover, these assembly techniques do not allow either to offer, or very hardly, component structures whose functional subassemblies integrate cavities and gaps therebetween to confer different mobility and functionality plays along the stacking axis of the subassemblies.

Embodiments of the present invention thus aim at solving at least partially the defects of clockmaking components formed based on semiconductor materials for the production of more robust and compact timepieces and clockwork mechanisms, and including fewer separate components.

SUMMARY

More precisely, and according to a first aspect, embodiments of the invention relate to a micromechanical timepiece, including a plurality of functional subassemblies secured together and superimposed on each other along a direction for forming a multi-level assembly, wherein each functional subassembly is constituted of the same semiconductor material and is secured to another subassembly by bridges constituted of the semiconductor material, and in that at least one subassembly includes at least two distinct portions, the portions being movable relative to each other and to another subassembly to which is secured at least one portion, by means of at least one deformable link integrally formed between the portions.

Advantageously, the subassemblies, their portions, the bridges and deformable link(s) form a monolithic piece.

In a preferred embodiment, the subassemblies and bridges are made of silicon (Si), silicon-germanium alloy ($Si_xGe_{1-x}$), germanium (Ge), gallium nitride (GaN), or silicon carbide (SiC).

In a particular embodiment, the subassemblies and bridges are made of polycrystalline or amorphous silicon.

In one embodiment, the subassemblies and bridges or parts thereof are made of doped silicon, in particular in order to make it conducting and/or to improve its thermo-compensation properties.

Advantageously, the subassemblies and bridges or parts thereof may further be coated with a functionalization layer, in particular a thermo-compensation layer, based on silicon dioxide ($SiO_2$) for example, a cushioning layer or a protective layer. To form these protective layers, polymeric materials such as parylene or a silane monolayer provide advantageous performances.

According to a particular embodiment of the invention, the subassemblies are spaced apart from each other by a distance comprised between 0.1 and 20 microns, preferably between 0.5 and 10 microns, by the bridges along the direction (Z).

Still advantageously, the deformable links are constituted of flexible blades whose thickness, measured in a plane perpendicular to the direction (Z) is comprised between 2 and 50 microns.

Advantageously, the portions of one subassembly are movable in rotation about a virtual axis of rotation or in translation in a plane perpendicular to the direction (Z).

In a further particular embodiment, at least two subassemblies directly superimposed along the direction (Z) form a trundle structure, that is to say composed of members secured to the subassemblies and nested within each other with a play, in particular in order to provide a movement limitation (stop, shock prevention) and/or guide device and/or to provide an auto-alignment along the direction (Z) between two subassemblies.

Advantageously, the trundle structure may include interdigital members, that is to say, equipped with fingers, extending from a base in opposite ways along directions parallel to the direction (Z), for example to limit the lateral stroke perpendicular to the direction (Z) of the subassemblies relative to each other.

According to a second object, the present invention also relates to a method for manufacturing a timepiece as defined previously.

Thus, this method substantially includes the following successive steps:
  a. Providing a substrate of a semiconductor material, the substrate preferably comprising alignment markers on a first face,
  b. Depositing, on a second face of the substrate, a sacrificial material layer of a determined height h and homogeneous over the entire area of the second face of the substrate;
  c. Structuring the sacrificial material layer by an etching process to form openings therein over its entire height h;
  d. Depositing a growth layer of a semiconductor material of the same nature as the substrate on the sacrificial material layer so as to fill the previously formed openings and thereby completely cover it,
  e. Structuring the growth layer by a deep etching process to form a first functional subassembly including portions movable relative to each other and to the substrate by means of at least one deformable link;
  f. Structuring the semiconductor material substrate by a deep etching process to form a second functional subassembly including portions movable relative to each other and to the growth layer by means of at least one deformable link;
  g. Removing the sacrificial material layer between the substrate and the growth layer to form linking bridges between the subassemblies and release the timepiece.

According to various characteristics of the method of the invention:
  steps e) and f) include the implementation of a reactive ion etching process;
  the substrate and the growth layer are formed of the same semiconductor material, in particular silicon (Si), silicon-germanium alloy ($Si_xGe_{1-x}$), germanium (Ge), gallium nitride (GaN), or silicon carbide (SiC);
  the substrate and the growth layer are formed of the same doped semiconductor material.
  the growth layer is formed by growth of silicon on the substrate in the openings formed in the sacrificial material layer and on its surface which, in the case of silicon as a growth layer, could be advantageously $SiO_2$.
  It includes a step of coating the subassemblies or a part thereof by a functionalization layer.
  steps b) to e) are repeated n times, n being an integer between 1 and 5, prior to or after step f).
  steps b) to e) are reproduced n times, n being an integer between 1 and 5, on both faces of the substrate.
  an intermediate step of flattening each growth layer is performed between steps d) and e), especially by polishing.

BRIEF DESCRIPTION OF THE DRAWINGS

Other details of the invention will appear more clearly upon reading the following description made with reference to the appended drawings in which.

DETAILED DESCRIPTION

Embodiments of the present invention proposes a new type of clockmaking components with a multi-level structure, that is to say including a plurality of functional "stages" secured to each other, these functional stages integrating elements movable relative to the other stages.

Other examples of such clockmaking components include in particular levers or jumpers, still mainly oscillators for regulating members.

Figure 1:
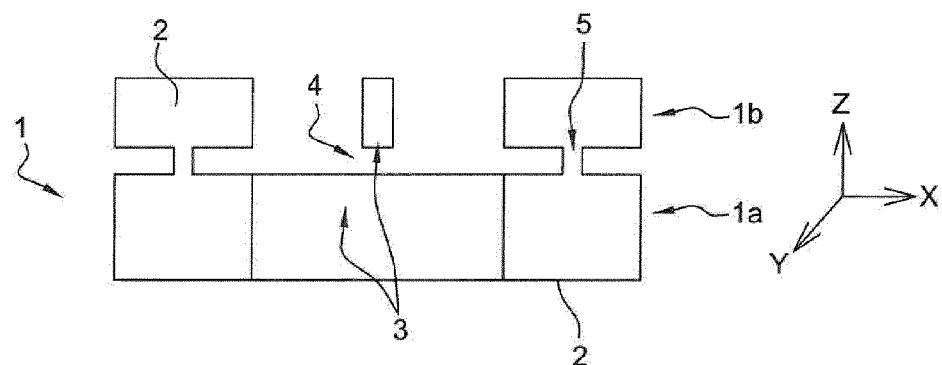
FIG. 1 represents a section in a vertical plane of a timepiece according to an embodiment of the invention.

FIG. 1 represents a sectional view along a vertical plane X-Z defined in an orthonormal reference frame X, Y, Z, of a first exemplary embodiment of a timepiece 1 according to an embodiment of the present invention as defined in the claims.

The timepiece 1 forms a clockmaking component of monolithic structure obtained by processes for etching a single semiconductor material as will be described later with reference to FIGS. 3 to 6.

The timepiece 1 includes in the represented example two functional subassemblies 1a, 1b secured together and superimposed on each other along the direction Z by bridges 5 integrally formed between the subassemblies 1a, 1b to form a multi-level component along at least this direction.

Each functional subassembly 1a, 1b and the bridges 5 are thus constituted of the same semiconductor material and the subassemblies 1a, 1b are spaced apart from each other by a distance comprised between 0.1 and 20 microns, preferably between 0.5 and 10 microns, by the bridges 5 in the direction Z.

In an inventive manner according to an embodiment of the present invention, at least one of the subassemblies 1a, 1b is composed of at least two distinct portions 2, 3, one of which, the portion 3 in the figures, is movable by means of at least one deformable link (not represented in the figures) relative to the other portion, the portion 2 in the figures, which is secured to at least one portion 2, 3 of the other subassembly 1a, 1b. The deformable link is advantageously integrally formed between portions 2, 3 during the etching of the timepiece, and takes in particular the form of one or several flexible blade(s) whose thickness, measured in a plane perpendicular to the direction Z is comprised between 2 and 50 microns preferably.

Thus, the subassemblies 1a, 1b are offset and separated from each other by a space 4 along the direction Z so that the movable portions 3 of each subassembly 1a, 1b can move without friction in planes parallel to the plane X-Y, perpendicular to the direction Z. Thus it is possible, advantageously by means of this inter-level play but also of the positioning and/or the number of deformable links formed between the portions 2, 3 of the subassemblies 1a, 1b, to organize a mobility of the portions and subassemblies in rotation about a virtual axis of rotation parallel to the axis Z, therefore also without friction about the virtual axis, or even in translation in a plane perpendicular to the axis Z, for example by means of parallel flexible blades between the portions 2, 3.

Figure 2:
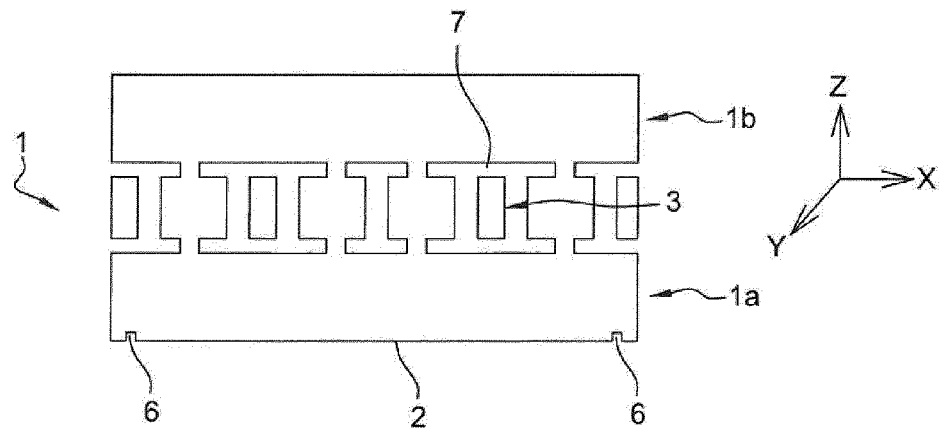
FIGS. 2 and 3 represent two variants of an embodiment of a timepiece according to the invention.
Figure 3:
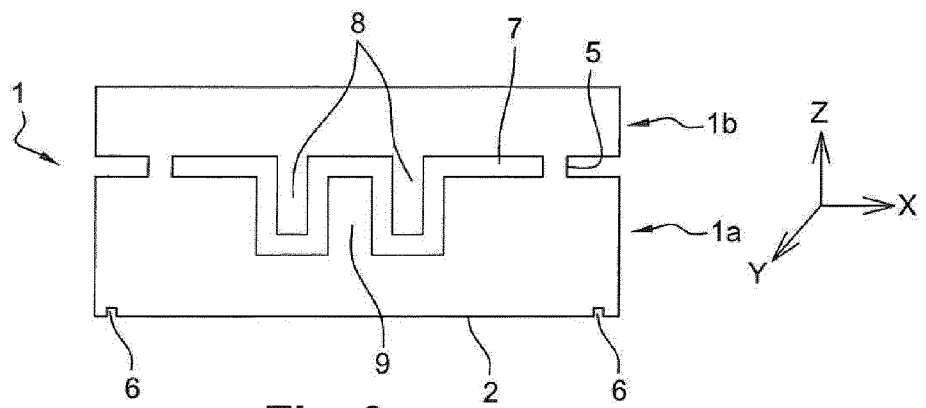

FIGS. 2 and 3 represent alternative embodiments of a timepiece according to embodiments of the invention.

FIG. 2 thus represents a timepiece 1 according to an embodiment of the invention in which cavities 7 are arranged and within which the movable portions 3 of one subassembly 1b are able to move. Such an embodiment thus has the advantage of providing a micromechanism, in this case the subassembly 1b at least, integrated or encapsulated, between two levels here constituted by lower 1a and higher 1c subassemblies. The timepiece 1 thus constituted is extremely robust and protected from the exogenous disturbances such as dust or the like that could be inserted otherwise between the portions 2, 3 of the piece and its subassemblies 1a, 1b.

FIG. 3, for its part, represents another variant of embodiment in which the timepiece 1 includes a cavity 7 arranged between two assemblies 1a, 1b superimposed along the direction Z and form a trundle structure composed of members 8, 9 nested within each other with a play along the direction Z, one of the members 8, 9 at least being also a movable portion 2, 3 of a subassembly 1a, 1b.

These nested members 8, 9 advantageously allow making an abutment structure internal to the timepiece 1, thus making it possible to limit the displacements and absorb the shocks of the movable portions 2, 3 in planes perpendicular to the axis Z, or even provide a movement guiding according to the particular configuration of the members 8, 9.

These can in particular take the form of fingers or combs extending from one subassembly 1a, 1b to the other subassembly in the opposite way and without contact therewith. They can also take any other suitable form as needed, provided that the members can interlock with each other along the axis Z.

According to the various preferred embodiments of the timepiece 1 of the invention described above, the constituent semiconductor material of the timepiece 1 and all its functional elements (subassembly 1a, 1b, bridges 5, flexible blades) is polycrystalline silicon.

However, amorphous silicon can also be used, as well as other semiconductor materials commonly used in particular in the fields of microelectronics, such as silicon-germanium ($Si_xGe_{1-x}$), germanium (Ge), gallium nitride (GaN), or silicon carbide (SiC) alloys.

The timepiece 1 of an embodiment of the invention allows for the first time the design and the production of micromechanical clockmaking components, and in particular of oscillators, equipped with a staged monolithic structure and integrating movable portions 3 by means of deformable links made in the mass of the timepiece 1 and of the different subassemblies 1a, 1b forming the levels or stages thereof. Such a monolithic structure of the timepiece 1 of an embodiment of the invention provides an optimal structural alignment of the different subassemblies 1a, 1b along the axis Z of superposition of the subassemblies 1a, 1b, which corresponds, as it will be apparent subsequently, to the axis of growth of the constituent material of the timepiece. The intrinsic mechanical strength of the timepiece 1 of an embodiment of the invention and its various subassemblies 1a, 1b and portions 2, 3 is thus greatly improved, as well as the accuracy of the mobility plays between movable portions, and therefore the accuracy and reliability of the timepiece 1 compared to analogous clockmaking components obtained by assembling the different subassemblies, in particular by complex techniques of bonding or hybridization of surface from components derived from silicon on insulator (or SOI) wafers.

In addition, the timepiece of an embodiment of the invention being formed of a single material without assembly, it also has a thermal expansion coefficient (CTE) homogeneous over the whole part, which allows greater stability and thermal response thereof, therefore a better potential isochronism of a regulating member integrating such a timepiece.

An optimization of the thermal expansion coefficient is also possible moreover by giving priority, as constituent material of the timepiece, to the use of doped silicon, in particular an n-type doping. Such doping may further provide, if necessary, a conducting character to the silicon forming the timepiece of the invention. It is also possible to optimize the global thermal expansion coefficient of the timepiece of embodiments of the invention by treatment of the subassemblies 1a, 1b and bridges 5 or parts thereof of a functionalization layer such as a thermo-compensation layer, for example silicon oxide in the case of a silicon micromechanism.

The implementation of a functionalization layer on the subassemblies 1a, 1b and bridges 5 or parts thereof is of course not limited only to the adjustment of the thermal properties of the timepiece 1 of an embodiment of the invention but can also be useful for any other functional improvement of the properties specific to the constituent material of the timepiece 1 or its performances over time. It is thus in particular possible to consider a coating of the subassemblies 1a, 1b and movable portions 3 thereof by a cushioning layer or a protective layer such as a corrosion prevention layer, a hydrophobic material layer, a chemical barrier layer or a tribological layer.

The timepiece 1 of an embodiment of the present invention in its general form represented in FIG. 1 can be obtained by the implementation of a manufacturing method implementing manufacturing techniques derived from MEMS (for micro electromechanical systems)-type microsystems. This method is represented in detail in FIGS. 4A to 4G and described hereinafter.

Figure 4A:
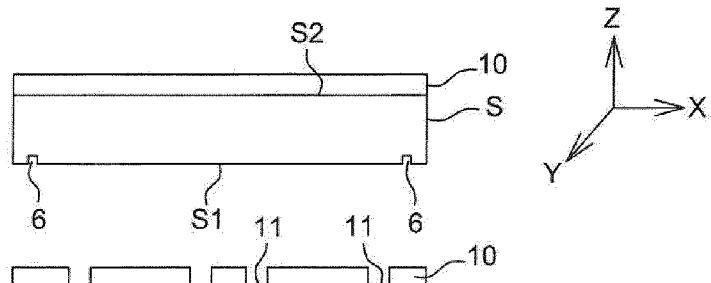
FIG. 4 represents the steps of the method for manufacturing the timepiece of FIG. 1.
Figure 4B:
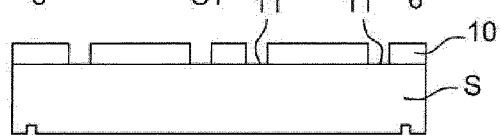

In a first step (a) represented in FIG. 4A, a silicon substrate S is firstly provided, which is equipped, on a first face S1, with alignment markers 6 adapted to position the substrate on a support in a reference position from which the substrate will be structured by successive steps.

In a second step (b), a sacrificial material layer 10, for example preferably silicon dioxide, is then deposited on a second face S2 opposite the first one of the substrate, over the entire area of the second face S2 of substrate S.

Then in a third step (c) represented in FIG. 2B, the sacrificial material layer 10 is structured by a deep etching process to form therein openings 11 over its entire height. The etching process may be of various natures but the reactive ion etching processes, better known under the acronym RIE for "Reactive Ion Etching", are privileged.

Figure 4C:
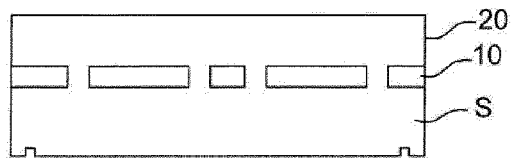
Figure 4D:
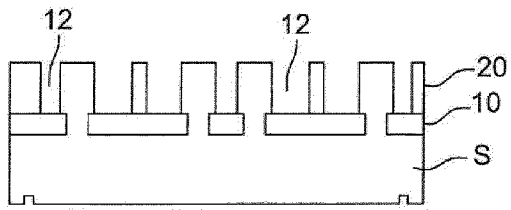
Figure 4E:
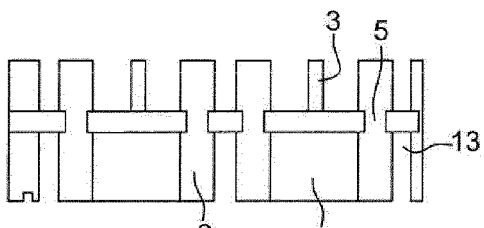

The sacrificial layer 10 being thus structured, a silicon growth layer 20 is then deposited thereon in a fourth step (d). This silicon layer 20, chemically identical to the substrate S thus fills, when deposited, the openings 11 previously formed in the sacrificial material layer 10 and completely covers it (FIG. 4C). Pillars or bonding pads are thus produced between the substrate S and the growth layer 20 by silicon growth on the sacrificial material layer 10.

Optionally, it will be possible to envisage after steps b) and/or d) an intermediate step of flattening the surface of the sacrificial material layer 10 and growth layer 20, in particular by polishing or grinding. Such a flattening step makes it possible to guarantee a state of a perfectly flat surface for the growth of the growth layer and/or any other additional layer.

The next two steps (e, f) then comprise structuring the growth layer (FIG. 4D) on the one hand, and the second substrate S (FIG. 4E) on the one hand, again by a deep etching process of the DRIE (for Deep Reactive Ion Etching) type, to form therein openings 12 delimiting portions 2, 3 of a first and a second subassembly 1a, 1b, a portion 3 being movable relative to the other via a deformable link at least. The formation of the portions 2, 3 then entirely results from the mask defining the particular configuration chosen by design by the designer(s) for the timepiece 1.

Figure 4F:
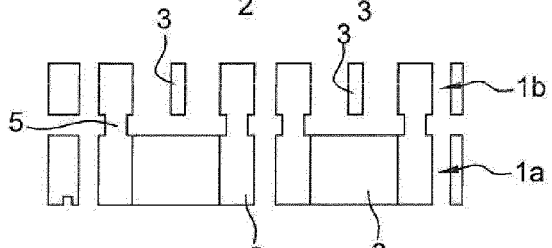
Figure 4G:
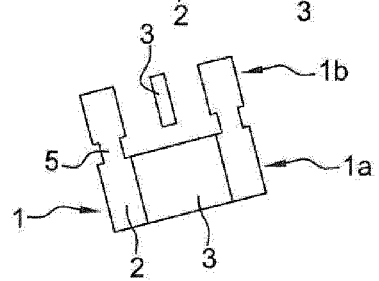

To finalize the piece, it is appropriate, as represented in FIG. 4F, to remove (g) the sacrificial material layer 10 between the substrate S and the growth layer 20 previously structured to form the linking bridges 5 between subassemblies 1a, 1b, and therefore, when necessary, only intermediate links (not represented in FIG. 4) between the individual pieces thus formed.

Finally, the timepiece(s) 1 thus formed in the substrate S is/are released, when necessary by breaking the intermediate links using any suitable tool.

As can be seen from the foregoing description, the method of embodiments of the invention includes no machining and the formation of the subassemblies 1a, 1b of the timepiece of embodiments of the invention substantially results from growth techniques, photolithography and etching methods, which ensures optimal alignment of the subassemblies 1a, 1b and their movable elements 3, 4 depending on the desired design, without the application of external mechanical stresses in the constituent material of the piece. There is no longer no need to assemble elements together, unlike the methods of the prior art known to produce multi-level micromechanical pieces, which guarantees the absence of fragile surfaces or interfaces between the subassemblies 1a, 1b and between the portions of the subassemblies, in particular at the movable portions 3.

The implementation of a structuring of the substrate S, of the sacrificial material layer 10 and of the growth layer 20 by etching processes allows in addition a very good dimensional control of the formed pieces and their functional elements, in particular deformable links between the portions 2, 3, as well as their geometry, despite their very small dimensions from a few tenths of millimeters to just a few millimeters. This ensures thus a better manufacturing reproducibility as well as better intrinsic and extrinsic quality of the timepieces 1 thus produced.

The removal of the sacrificial layer 10 of silicon dioxide, in the case of use of silicon as a structural material, before release of the timepieces 1 can be carried out conventionally by chemical etching based on hydrofluoric acid in liquid or gaseous phase for example.

In addition, when intermediate links are provided between several timepieces 1 formed simultaneously from a silicon substrate S, these links can meet the principles described in the patent application EP 2794463 A1 of the Applicant in order to allow a release that generates the least amount of possible constraints in the pieces.

As previously described with reference to FIGS. 1 to 3, the substrate S and the growth layer 20 implemented in the method of embodiments of the invention, are constituted of the same semiconductor material, preferably polycrystalline or amorphous silicon, doped when necessary. Other semiconductor materials are also conceivable, in particular silicon-germanium alloys ($Si_xGe_{1-x}$), Germanium (Ge), Gallium Nitride (GaN), or Silicon Carbide (SiC) as previously described.

It is also conceivable to provide, within the context of the inventive method, a step of coating the subassemblies 1a, 1b or a part thereof with a functionalization layer.

Moreover, although it has been described and represented in the figures for the production of timepieces 1 composed substantially of two sub-assemblies 1a, 1b forming two functional levels, it is quite conceivable without departing from the scope of the invention to multiply the number of subassemblies beyond two, and this from each surface S1, S2 of the silicon substrate (or other appropriate semiconductor material). For this, it is enough to repeat steps b) to e) n times, n being an integer between 1 and 5, prior to or after step f) on either of the faces of the substrate S.

FIGS. 5A to 5G represent a variation of the manufacturing method previously described and represented in FIG. 4, and more particularly of step d) of structuring the growth layer 20 to obtain a timepiece 1 as represented in FIG. 2, including one or more cavity/cavities 7.

Figure 5A:
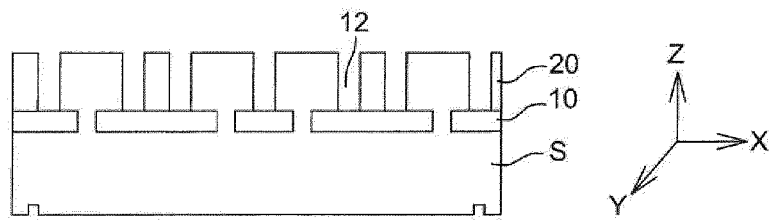
FIG. 5 represents a variant of the method for manufacturing a timepiece of FIG. 4.
Figure 5B:
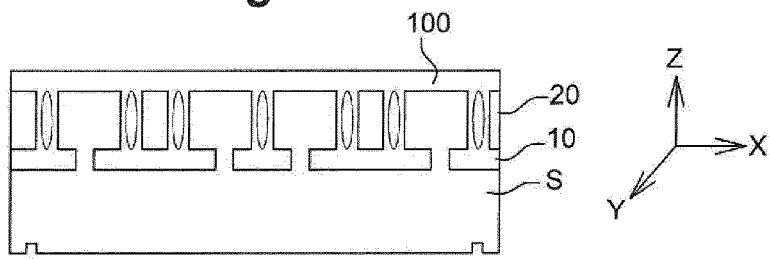

FIG. 5A represents the intermediate state of a timepiece according to an embodiment of the invention at the end of step d) of structuring the growth layer. Instead of carrying out the structuring of the substrate S as in the method of FIG. 4, a new step of depositing a second layer 100 of sacrificial material, preferably the same as the first one and therefore $SiO_2$ is performed here as represented in FIG. 5B. This second layer 100 then fills the openings 12 previously structured by etching in the growth layer 20.

Figure 5C:
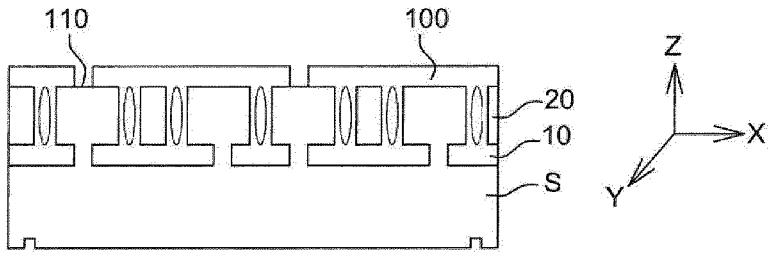
Figure 5D:
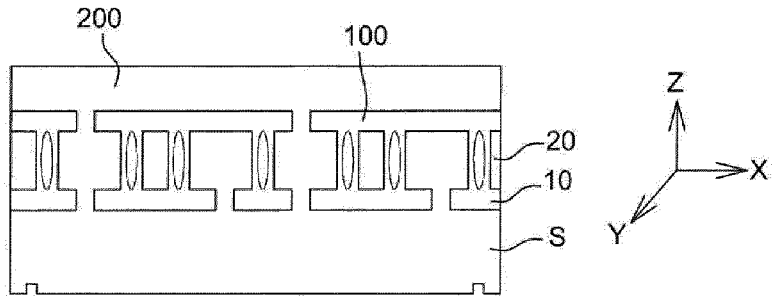

A new structuring of the second sacrificial material layer 100 is then carried out in FIG. 5C identically to step c) of the method of FIG. 4, to form therein openings 110, which are then filled as represented in FIG. 5D by a second silicon growth layer 200.

Thus, the first and second sacrificial material layers 10, 100 form between the substrate S, the first growth layer 20 and the second growth layer 200, a dissolvable sacrificial core that can then be dissolved to release the cavities 7 and form the timepiece 1 of FIG. 2.

Figure 5E:
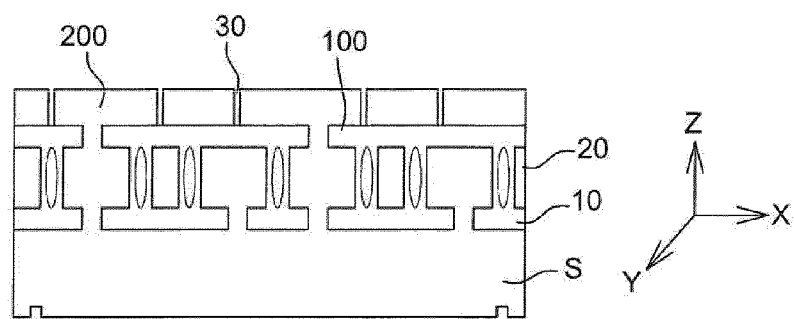
Figure 5F:
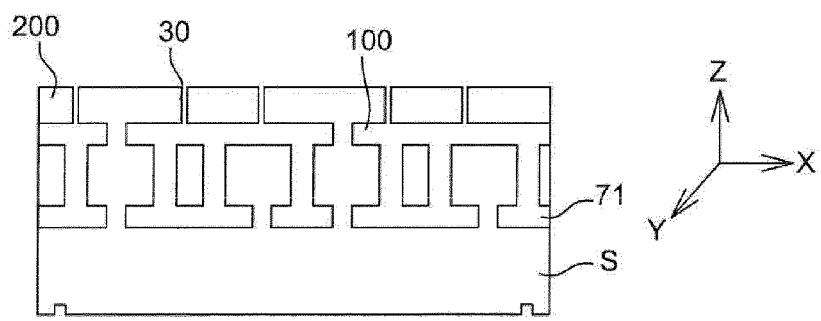
Figure 5G:
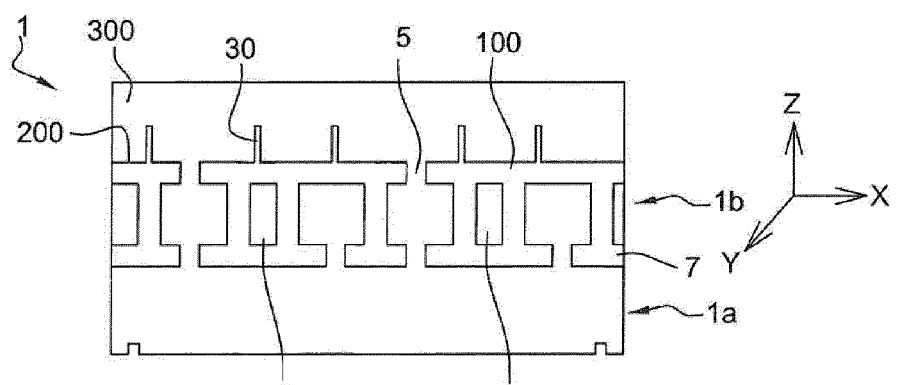

For this, as represented in FIGS. 5E and 5F, thin injection channels device 30 are pierced in the second growth layer 200, in which a dissolution solution of the sacrificial material layers 10 and 100 is then injected, layers which are discharged by the same channels 30, to release the cavities 7.

Once the cavities 7 are released, a last step of growth of silicon can be performed by a cover layer 300 which closes the channels 30 and seals the timepiece 1 thus constituted, ensuring perfect protection of the internal movable portions.

It should also be noted that the method of FIG. 5 also allows producing timepieces equipped with trundle structures as represented in FIG. 3 and previously described.

Embodiments of the present invention thus provides a new type of micromechanical clockmaking components and timepieces with a multi-level structure and incorporating movable functional elements by deformable links of the flexible blade type and methods for manufacturing same.

The invention claimed is:

1. A micromechanical timepiece, including a plurality of functional subassemblies secured together and superimposed on each other along a direction (Z) for forming a multi-level assembly, wherein each functional subassembly is constituted of the same semiconductor material and is secured to another functional subassembly by bridges comprising said semiconductor material, and in that at least one functional subassembly includes at least two portions, said portions being movable relative to each other in a plane transverse to the direction (Z) and movable in the direction (Z) relative to another functional subassembly secured to at least one of said portions.

2. The timepiece according to claim 1 wherein said sub-assemblies, their portions, and the bridges form a monolithic piece.

3. The timepiece according to claim 1 wherein said subassemblies and bridges are made of silicon (Si).

4. The timepiece according to claim 1 wherein said subassemblies and bridges are made of polycrystalline or amorphous silicon.

5. The timepiece according to claim 1, wherein said subassemblies and bridges or parts thereof are made of doped silicon.

6. The timepiece according to claim 1, wherein said subassemblies and bridges or parts thereof are coated with a functionalization layer.

7. The timepiece according to claim 1, wherein it includes a cavity arranged between said subassemblies.

8. The timepiece according to claim 1, wherein said portions of one said subassembly are movable in rotation about a virtual axis of rotation or in translation in a plane perpendicular to the axis (Z).

9. The timepiece according to claim 1, wherein at least two said subassemblies directly superimposed along the direction (Z) form a trundle structure composed of members nested within each other with a play along the direction (Z), so as to limit and/or guide the movements of the movable portions of said subassemblies along directions parallel to the direction (Z).

10. A clockwork movement including a timepiece according to claim 1.

11. The timepiece according to claim 6, wherein the functionalization layer is a thermo-compensation layer, a cushioning layer, or a protective layer.

* * * * *